(12) United States Patent
Cheng et al.

(10) Patent No.: US 8,987,790 B2
(45) Date of Patent: Mar. 24, 2015

(54) FIN ISOLATION IN MULTI-GATE FIELD EFFECT TRANSISTORS

(71) Applicant: International Business Machines Corporation, Armonk, NY (US)

(72) Inventors: Kangguo Cheng, Schenectady, NY (US); Balasubramanian S. Haran, Watervliet, NY (US); Ali Khakifirooz, Mountain View, CA (US); Shom Ponoth, Clifton Park, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/684,818

(22) Filed: Nov. 26, 2012

(65) Prior Publication Data

US 2014/0145247 A1    May 29, 2014

(51) Int. Cl.
*H01L 29/76* (2006.01)
*H01L 29/66* (2006.01)
*H01L 29/78* (2006.01)

(52) U.S. Cl.
CPC ........ *H01L 29/66545* (2013.01); *H01L 29/785* (2013.01)
USPC .............. 257/288; 257/E21.002; 438/443

(58) Field of Classification Search
USPC .............. 257/288, E21.002; 438/443, 3
See application file for complete search history.

(56) References Cited

U.S. PATENT DOCUMENTS

| 6,483,156 B1* | 11/2002 | Adkisson et al. .............. 257/401 |
| 6,852,576 B2 | 2/2005 | Lin et al. |
| 6,936,516 B1 | 8/2005 | Goo et al. |
| 7,060,539 B2 | 6/2006 | Chidambarrao et al. |
| 7,994,020 B2 | 8/2011 | Lin et al. |
| 2005/0077553 A1 | 4/2005 | Kim et al. |
| 2007/0161171 A1 | 7/2007 | Burnett et al. |
| 2010/0015778 A1* | 1/2010 | Lin et al. ........................ 438/443 |
| 2012/0043597 A1 | 2/2012 | Chen et al. |
| 2012/0086053 A1 | 4/2012 | Tseng et al. |
| 2012/0193751 A1 | 8/2012 | Kawasaki et al. |
| 2013/0059401 A1* | 3/2013 | Sudo ................................. 438/3 |
| 2013/0075812 A1* | 3/2013 | Ho et al. ........................ 257/330 |
| 2013/0228778 A1* | 9/2013 | Tsai et al. ......................... 257/48 |

FOREIGN PATENT DOCUMENTS

| CN | 102194756 A | 9/2011 |
| JP | 2008529295 A | 7/2008 |
| KR | 1020050003401 A | 1/2005 |
| KR | 1020070003861 A | 1/2007 |
| KR | 1020110092299 A | 8/2011 |
| WO | 2012066049 A1 | 5/2012 |

OTHER PUBLICATIONS

International Search Report and Written Opinion; International Application No. PCT/US2013/068633; International Filing Date: Nov. 6, 2013; Date of Mailing: Mar. 21, 2014; pp. 1-9.

* cited by examiner

*Primary Examiner* — Matthew Gordon
(74) *Attorney, Agent, or Firm* — Cantor Colburn LLP; Catherine Ivers (57) ABSTRACT

A method for fabricating a field effect transistor (FET) device includes forming a plurality of semiconductor fins on a substrate, removing a semiconductor fin of the plurality of semiconductor fins from a portion of the substrate, forming an isolation fin that includes a dielectric material on the substrate on the portion of the substrate, and forming a gate stack over the plurality of semiconductor fins and the isolation fin.

15 Claims, 12 Drawing Sheets

FIN ISOLATION IN MULTI-GATE FIELD EFFECT TRANSISTORS

BACKGROUND

The present invention relates to field effect transistors, and more specifically, to multi-gate field effect transistors. Multi-gate field effect transistors (FETs) often include a semiconductor fin or similar structure arranged on a substrate. The fin partially defines active regions (source and drain regions) and a channel region of the device. The geometry of the fin provides a multi-gate FET device.

One method for fabricating multi-gate FETs such as Fin-FETs includes patterning a number of fins on a substrate. Once the fins are patterned, a dummy gate stack that includes a polysilicon material is patterned over portions of the fins. The dummy gate stack may be formed by a material deposition process followed by a patterning and etching process. The dummy gate stack defines the channel regions of the FETs. The active regions may be increased in size and connected to adjacent fins by performing an epitaxial growth process that grows epitaxial semiconductor material from the fins. Once the active regions are formed and doped either during the epitaxial growth process or with an ion implantation process, the dummy gate stack may be removed, and the gate stack may be formed over the channel regions of the fins.

In previous fabrication processes, a number of fins are patterned with substantially equal spacing between the fins. In order to fabricate multi-FET devices that each includes a plurality of fins, one or more fins may be removed from the substrate to isolate each of the multi-FET devices.

Figure 1:
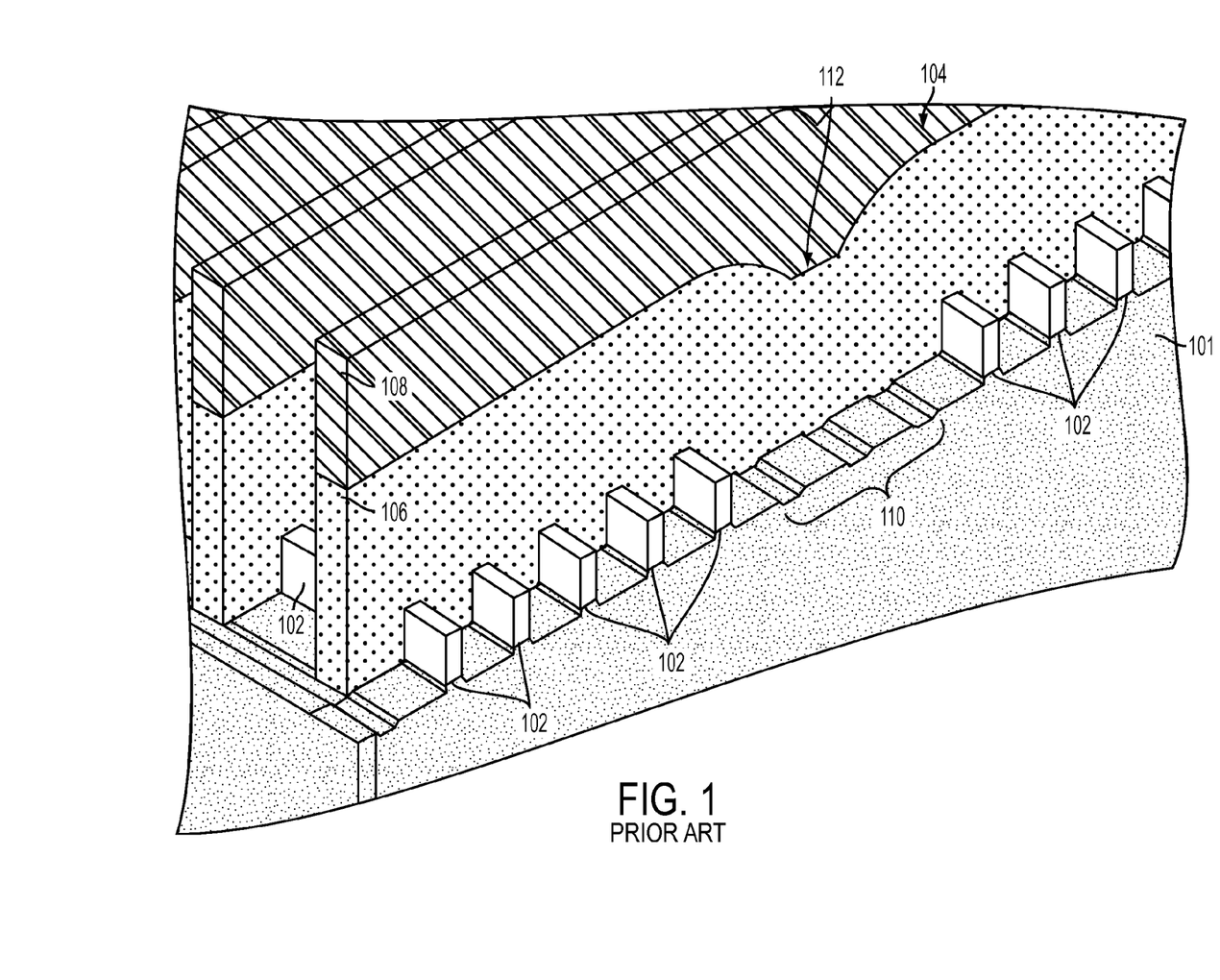
FIG. 1 illustrates a perspective view of a prior art example of multi-FET devices in fabrication.

FIG. 1 illustrates a perspective view of a prior art example of multi-FET devices in fabrication. In this regard, fins 102 are arranged on a substrate 101. A gate stack 104 that includes a polysilicon material layer 106 and a capping layer 108 has been patterned over the fins 102. The region 110 of the substrate 101 does not include fins 102. The fins 102 that were previously patterned in the region 110 were removed prior to the deposition and patterning of the dummy gate stack 104. The region 110 absent the fins 102, results in a dip or a depression 112 in the surface of the polysilicon layer 106 of the dummy gate stack 104 that is disposed on the region 110 and the capping layer 108 disposed on the polysilicon layer 106 on the region 110.

SUMMARY

According to an embodiment of the present invention, a method for fabricating a field effect transistor (FET) device includes forming a plurality of semiconductor fins on a substrate, removing a semiconductor fin of the plurality of semiconductor fins from a portion of the substrate, forming an isolation fin that includes a dielectric material on the substrate on the portion of the substrate, and forming a gate stack over the plurality of semiconductor fins and the isolation fin.

According to another embodiment of the present invention, a method for fabricating a field effect transistor (FET) device includes patterning a first semiconductor fin, a second semiconductor fin, and a third semiconductor fin on a substrate, the second semiconductor fin arranged between the first semiconductor fin and the third semiconductor fin, the first semiconductor fin, the second semiconductor fin and the third semiconductor fin having a hardmask layer disposed thereon, depositing a sacrificial layer over exposed portions of the substrate and the hardmask layer, removing portions of the sacrificial layer to expose portions of the hardmask layer, removing the hardmask layer disposed on the second semiconductor fin and removing the second semiconductor fin to form a cavity, depositing a dielectric material in the cavity, removing the sacrificial layer to define an isolation fin that includes the dielectric material in the cavity, and expose the first semiconductor fin and the third semiconductor fin, and forming a gate stack over a portion of the first semiconductor fin, the isolation fin, and the third semiconductor fin.

According to yet another embodiment of the present invention, a field effect transistor device includes a first semiconductor fin disposed on a substrate, a second semiconductor fin disposed on the substrate, an isolation fin comprising a dielectric material disposed on the substrate, the isolation fin arranged between the first semiconductor fin and the second semiconductor fin, a gate stack arranged over a channel region of the first semiconductor fin and a channel region of the second semiconductor fin.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The prior art example of a fin and dummy gate stack arrangement illustrated in FIG. 1 includes an undesirable depression 112 or reduction in the height of the dummy gate stack 104 in regions of the substrate 101 that do not include fins 102. The methods and illustrated embodiments discussed below offer a solution that avoids forming an undesirable dip and provide a dummy gate stack that has a substantially more uniform height when formed over semiconductor fins and isolation regions arranged between FET devices. The improved dummy gate stack provides improved multi-FET devices.

Figure 2:
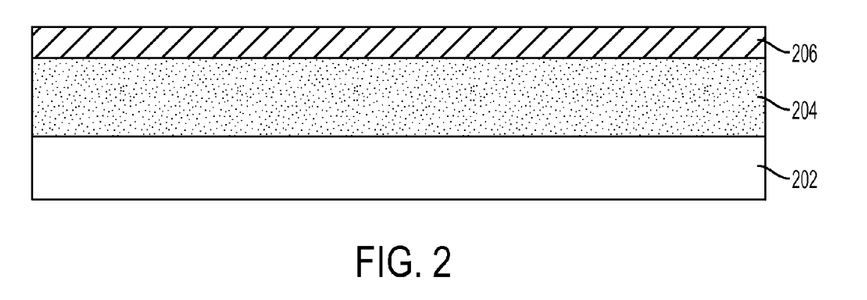
FIG. 2 illustrates a side view of a substrate, a semiconductor layer, and a hardmask layer.

In this regard, FIG. 2 illustrates a side view of a substrate 202, a semiconductor layer 204 arranged on the substrate, and a hardmask layer 206 arranged on the semiconductor layer 204. The substrate 202 of the illustrated embodiment includes an insulator material such as, for example, a buried oxide layer of a semiconductor-on-insulator wafer. Alternate embodiments may include a substrate 202 that includes a bulk semiconductor material such as, for example, a silicon or a germanium material. In such alternate embodiments, the fins 304 (described below) may be formed from the bulk semiconductor material. The semiconductor layer 204 may include any semiconductor material such as, for example, a silicon material or a germanium material. The hardmask layer 206 may include a hardmask material such as, for example, an oxide or a nitride material. In the illustrated embodiment, the hardmask layer 206 includes a nitride material.

Figure 3:
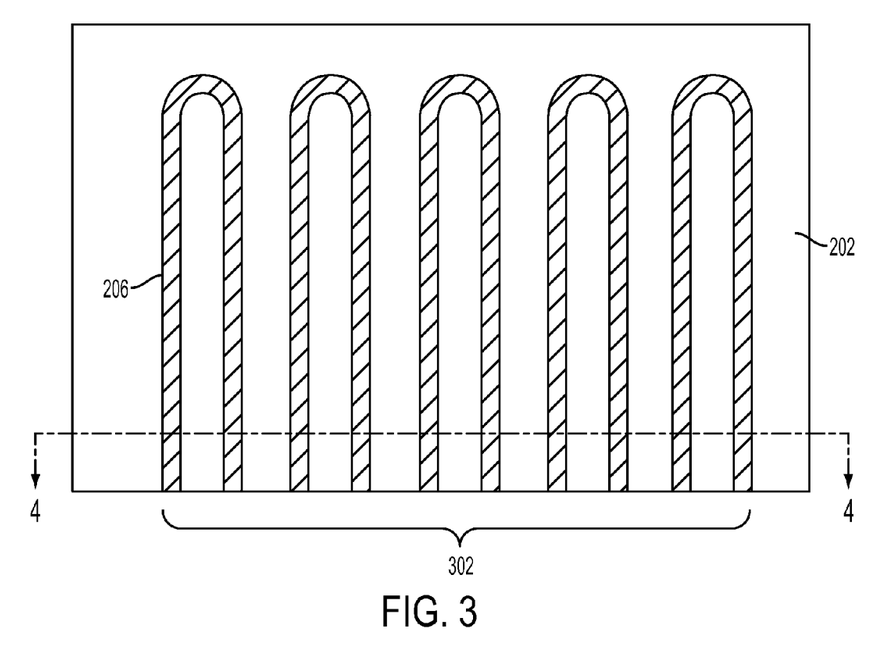
FIG. 3 illustrates a top view of the resultant structure following the patterning and etching of a plurality of semiconductor fins.
Figure 4:
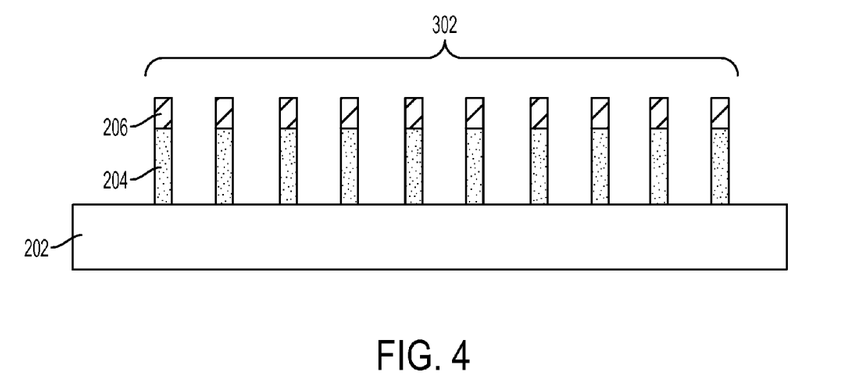
FIG. 4 illustrates a side cut away view along the line 4 of FIG. 3.

FIG. 3 illustrates a top view of the resultant structure following the patterning and etching of a plurality of semiconductor fins 302. The semiconductor fins 302 may be formed by, for example, a lithographic patterning process followed by an etching process such as, reactive ion etching (RIE) that removes exposed portions of the hardmask layer 206 and the semiconductor layer 204 to expose portions of the substrate 202. FIG. 4 illustrates a side cut away view along the line 4 (of FIG. 3).

Figure 5:
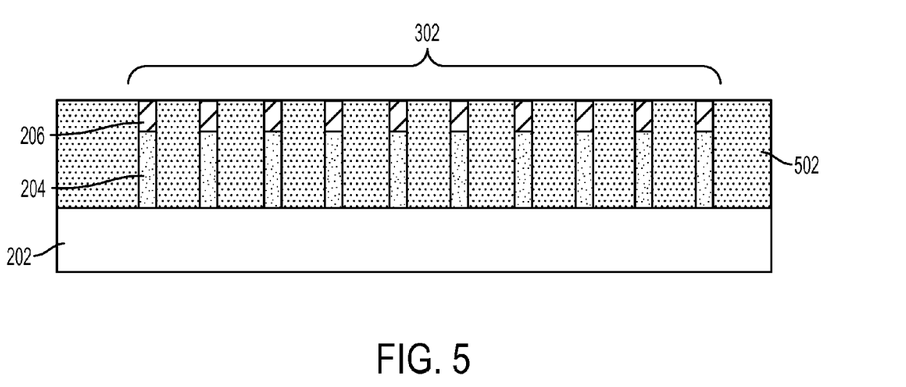
FIG. 5 illustrates a side view of the resultant structure following the deposition of a sacrificial layer.

FIG. 5 illustrates a side view of the resultant structure following the deposition of a sacrificial layer 502 over the semiconductor fins 302 and exposed portions of the substrate 202. The sacrificial layer 502 may include, for example, a flowable oxide or similar material that is deposited over the semiconductor fins 302 and exposed portions of the substrate 202, and subsequently planarized using for, example, a chemical mechanical polishing (CMP) method that removes portions of the sacrificial layer 502 to expose portions of the hardmask layer 206. The planarization process may be controlled such that the planarization process ceases when the hardmask layer 206 material is exposed.

Figure 6:
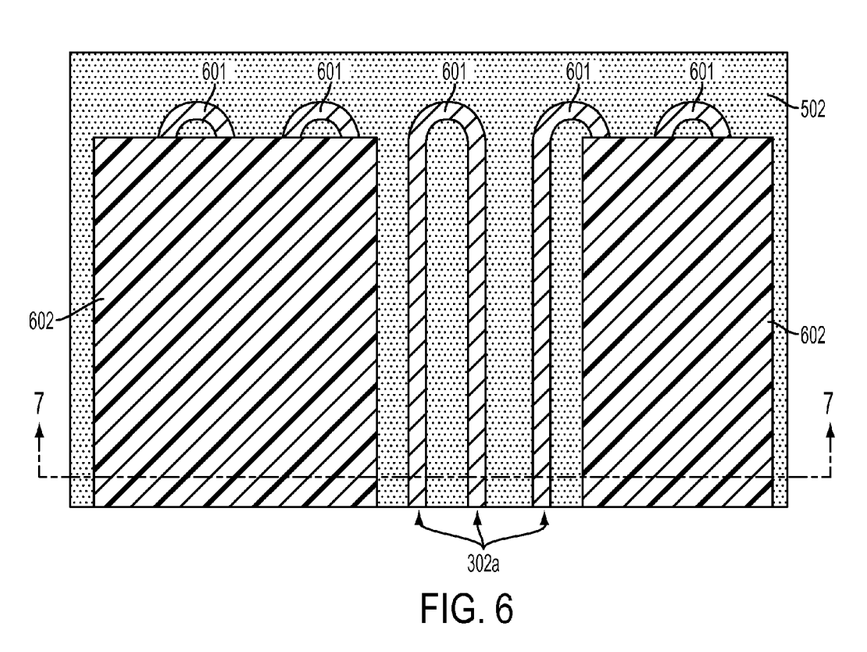
FIG. 6 illustrates a top view following the patterning of a photolithographic resist.
Figure 7:
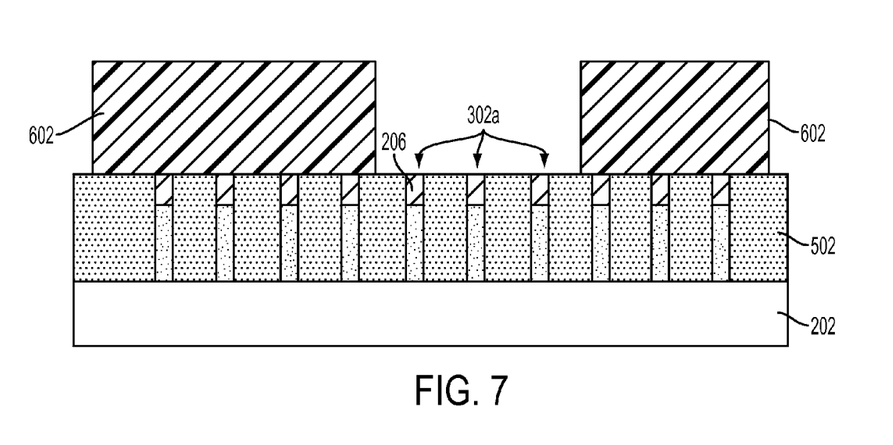
FIG. 7 illustrates a cut away view along the line 7 of FIG. 6.

FIG. 6 illustrates a top view following the patterning of a photolithographic resist (resist) 602 over portions of the hardmask layer 206 and the sacrificial layer 502. The resist 602 defines the semiconductor fins 302a that will be removed to isolate multi-FET devices that will be formed in subsequent processes (described below). In the illustrated embodiment, the semiconductor fins 302 have distal ends 601 that connect adjacent semiconductor fins 302. In the illustrated embodiment, the distal ends 601 remain exposed such that portions of the distal ends 601 may be removed to isolate each semiconductor fin 302 from adjacent semiconductor fins 302. FIG. 7 illustrates a cut away view along the line 7 (of FIG. 6).

Figure 8:
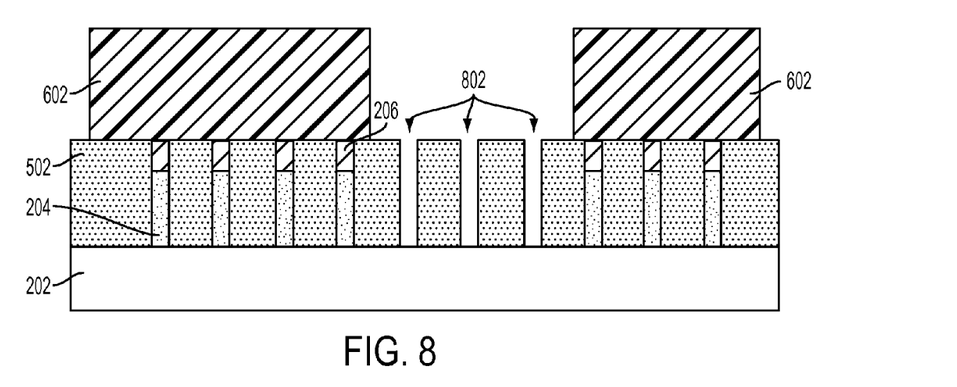
FIG. 8 illustrates the removal of exposed hardmask and semiconductor fins to form cavities.

FIG. 8 illustrates the removal of exposed hardmask 206 material and semiconductor fins 302a (of FIG. 7) to form cavities 802. The exposed hardmasks 206 may be removed using an anisotropic etching process that selectively removes the hardmask 206 material (e.g., nitride) without appreciably removing the exposed portions of the sacrificial layer 502. Once the hardmask 206 material is removed, the exposed semiconductor fins 302a may be removed using, for example, an anisotropic etching process that is selective to remove the exposed semiconductor layer 204 material without appreciably removing exposed portions of the sacrificial layer 502. The cavities 802 are defined by the substrate 202 and the sacrificial layer 502.

Figure 9:
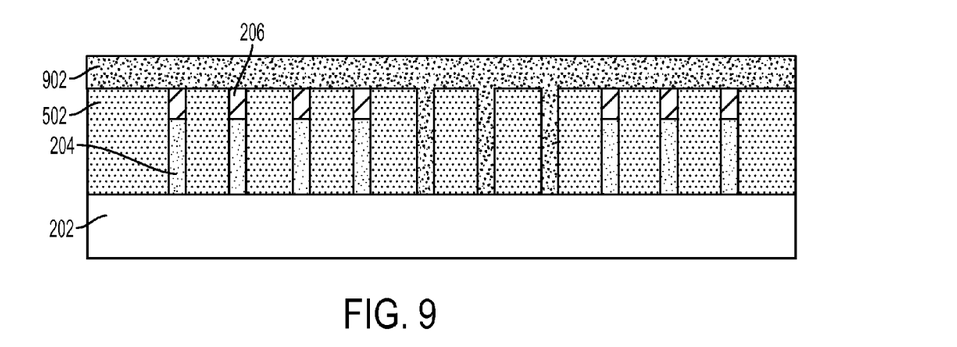
FIG. 9 illustrates the deposition of a dielectric material layer.

FIG. 9 illustrates the deposition of a dielectric material layer 902 that is deposited over the sacrificial layer 502 and the hardmasks 206, and fills the cavities 802 (of FIG. 8). The dielectric material layer 902 may include any suitable dielectric material or combinations of layers of materials such as, for example, hafnium oxide, aluminum oxide, SiC, SiCBN, or SiN. In some exemplary embodiments, the dielectric material layer 902 may include a material that is resistant to some etching processes such as, for example, HF chemical etching or chemical oxide removal etching. For illustrative purposes, the dielectric material layer 902 (and the resultant isolation fins 1002 described below) are shown as a single layer of material. Exemplary embodiments of the dielectric material layer 902 and the resultant isolation fins 1002 may include, for example, multiple layers of similar or dissimilar materials that may be disposed in horizontally or vertically arranged layers relative to the substrate 202 by any suitable material deposition process.

Figure 10:
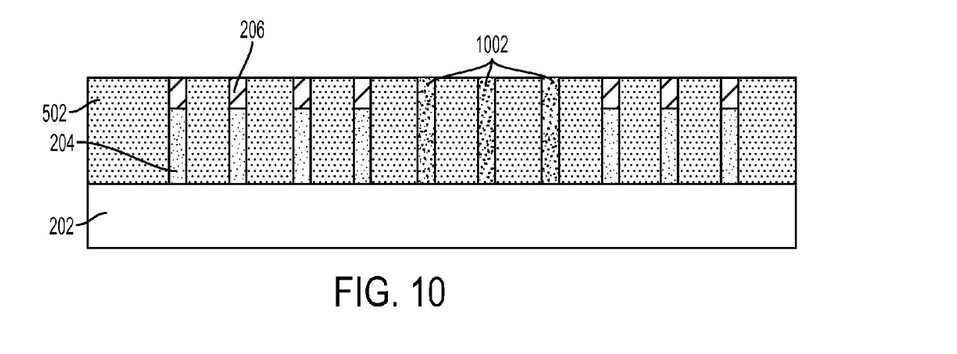
FIG. 10 illustrates the resultant structure following the removal of portions of the dielectric material layer.

FIG. 10 illustrates the resultant structure following the removal of portions of the dielectric material layer 902 to expose the hardmasks 206 and portions of the sacrificial layer 502. The removal of portions of the dielectric material layer 902 defines isolation fins 1002 in the cavities 802 (of FIG. 8). The portions of the dielectric material layer 902 may be removed by, for example, a planarization process such as CMP that ceases removing the dielectric material layer 902 when the hardmasks 206 are exposed.

Figure 11:
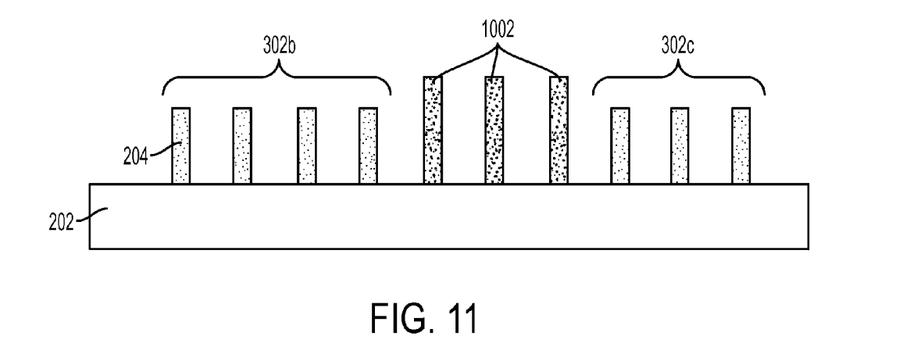
FIG. 11 illustrates a side view of the removal of hardmasks and the sacrificial layer.

Referring to FIG. 11, the hardmasks 206 are removed using a selective etching process that removes the hardmask 206 material and exposes portions of the semiconductor fins 302b and 302c. The sacrificial layer 502 (of FIG. 10) is removed using an etching process that selectively removes the sacrificial layer 502 material and exposes the semiconductor fins 302b and 302c, isolation fins 1002, and portions of the substrate 202. Though the illustrated embodiment shows the removal of the hardmask 206 material, alternate exemplary embodiments may leave the hardmask layer 206 disposed on the semiconductor fins 302. In such embodiments, the hardmask layer 206 may be removed in the channel regions of the FET devices prior to the formation of the gate stack (described below).

Figure 12:
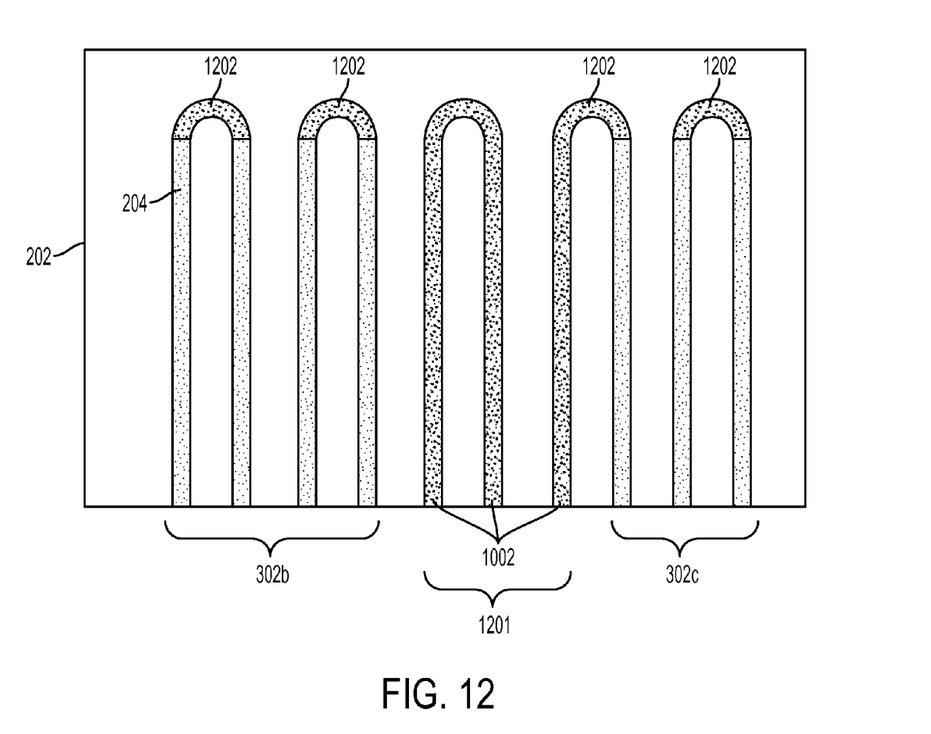
FIG. 12 illustrates a top view of the arrangement shown in FIG. 11.

FIG. 12 illustrates a top view of the arrangement shown in FIG. 11. In this regard, the isolation fins 1002 partially define an isolation region 1201 that is arranged between the semiconductor fins 302b and 302c. The isolation region 1201 facilitates the formation of isolated multi-FET devices that include the semiconductor fins 302b and 302c. The distal ends 601 (of FIG. 6) of the semiconductor fins 302 have been replaced with dielectric material during the filling of the cavities 802 (of FIG. 8) resulting in distal ends 1202 that include dielectric material. The distal ends 1202 electrically isolate adjacent semiconductor fins 302.

Figure 13:
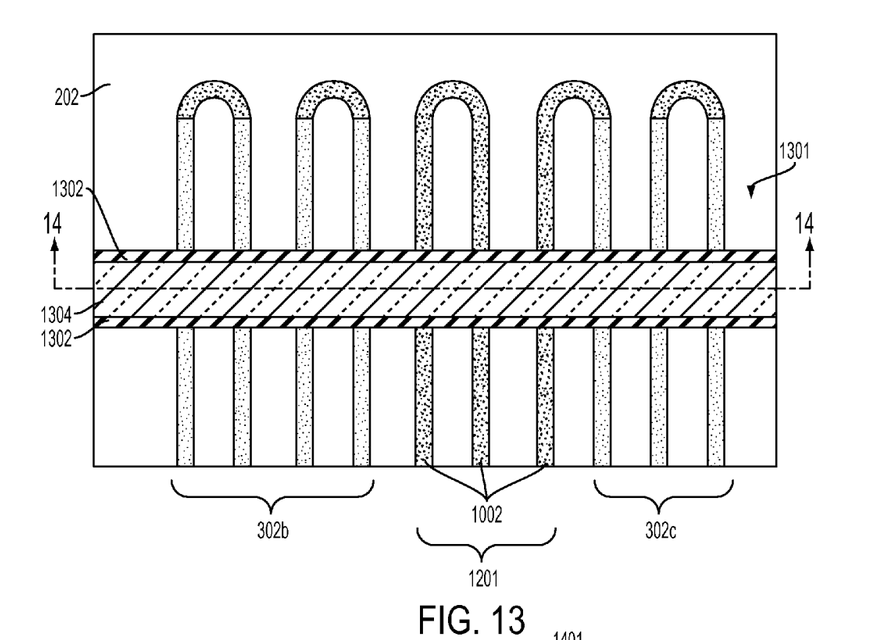
FIG. 13 illustrates the formation of a dummy gate stack.

FIG. 13 illustrates the formation of a dummy gate stack 1301 over portions of the semiconductor fins 302b and 302c and the isolation fins 1002. Before the dummy gate stack (polysilicon) deposition, a thin conformal layer of dummy oxide (not shown) may be deposited. The layer may include, for example, a 2 nm thick layer of conformal silicon oxide. The dummy gate stack 1301 may be formed by, for example, depositing a layer of polysilicon material (described below) conformally over the semiconductor fins 302b and 302c, the isolation fins 1002, and exposed portions of the substrate 202. A capping layer 1304 may be deposited over the polysilicon material. The capping layer may include, for example, a nitride or an oxide material. The polysilicon material and the capping layer 1304 may be formed by, for example, a chemical vapor deposition (CVD), a plasma enhanced chemical vapor deposition (PECVD), or a spin coating method. Once the polysilicon material layer and the capping layer 1304 are deposited, the layers may be patterned and etched using for example, a photolithographic patterning and etching process to remove portions of the polysilicon material layer and the capping layer 1304 to define the dummy gate stack 1301. Spacers 1302 may be formed along opposing sidewalls of the dummy gate stack 1301 using, for example, a conformal deposition process followed by an etching process that defines the spacers 1302. The spacers 1302 may include, for example, an oxide or nitride material.

Though the illustrated embodiments describe the formation of a dummy gate stack 1301, alternate embodiments may omit the formation of the dummy gate stack 1301. In this regard, a FET gate stack (not shown) may be formed by, for example, depositing a dielectric layer conformally over the semiconductor fins 302b and 302c, the isolation fins 1002, and exposed portions of the substrate 202, and depositing a gate metallic layer over the dielectric layer. A lithographic patterning and etching process may be performed to pattern the gate stack. In some exemplary embodiments spacers may be formed adjacent to the gate stack in a similar manner as described above. In such an embodiment, the resultant gate stack is similar to the gate stack described below.

Figure 14:
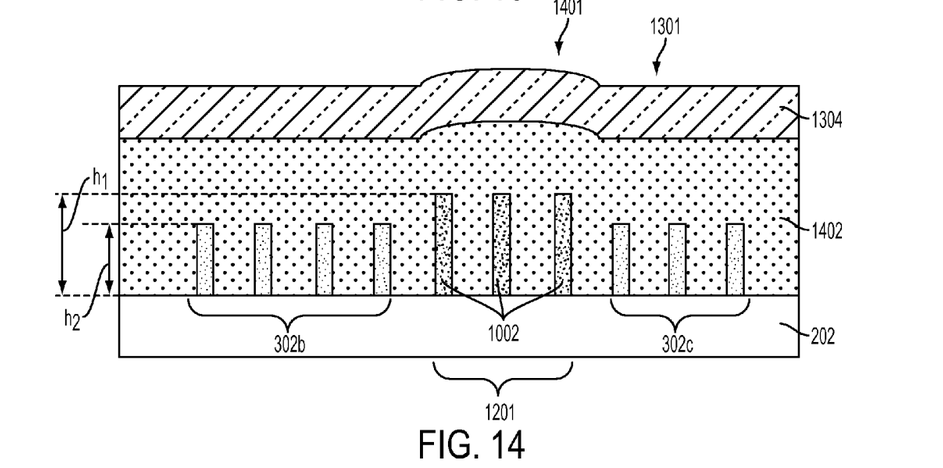
FIG. 14 illustrates a cut away view along the line 14 of FIG. 13.

FIG. 14 illustrates a cut away view along the line 14 (of FIG. 13). Referring to FIG. 14, the polysilicon layer 1402 is shown arranged conformally over the semiconductor fins 302b and 302c, the isolation fins 1002, and portions of the substrate 202. The height ($h_1$) of the isolation fins 1002 in the illustrated embodiment is slightly greater than the height ($h_2$) of the semiconductor fins 302b and 302c. The difference in height between the semiconductor fins 302b and 302c and the isolation fins 1002 may result in a slight bulge 1401 in dummy gate stack 1301 over the isolation region 1201. However, the height of the bulge 1401 relative to the height of the dummy gate stack 1301 above the semiconductor fins 302b and 302c is less than the depth of the depression 112 described above in FIG. 1. Thus, the height of the dummy gate stack 1301 is more uniform when the isolation fins 1002 are formed as compared to an isolation region that does not include the isolation fins 1002.

Figure 15:
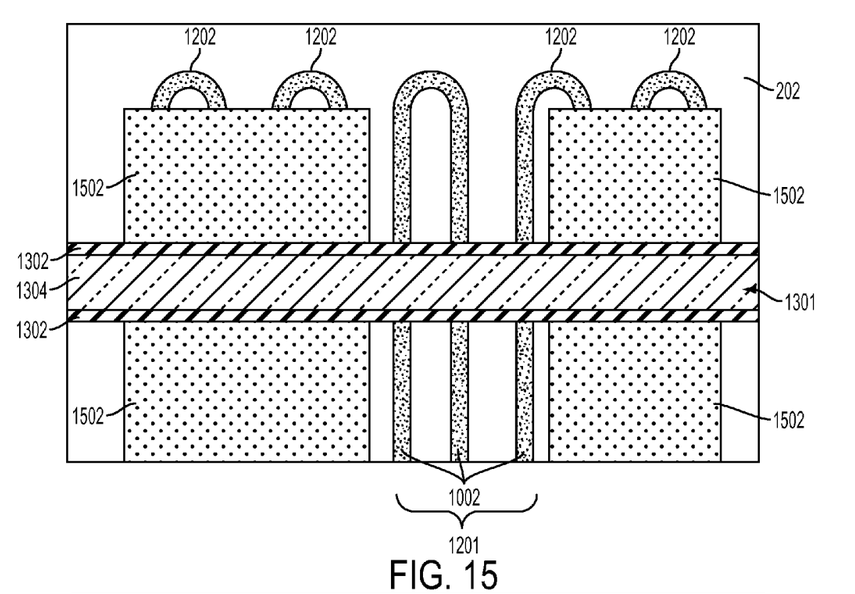
FIG. 15 illustrates a top view of the formation of active regions.

Referring to FIG. 15, once the dummy gate stack 1301 is formed, active regions 1502 (source and drain regions) may be formed. The active regions 1502 of the illustrated embodiment are formed by, for example, an epitaxial growth process that grows an epitaxial semiconductor material from exposed portions of the semiconductor fins 302b and 302c. The epitaxial semiconductor material may be doped with ions in-situ during the epitaxial growth process. Alternatively, once the epitaxial semiconductor material is grown, ions may be implanted using a suitable ion implantation process. The dielectric material that defines the isolation fins 1002 and the distal ends 1202 does not provide surfaces for the epitaxial growth, and thus, the isolation region 1201 remains substantially free of semiconductor material; preventing a electrical path or short from forming between active regions 1502 of the adjacent multi-FET devices that will be formed in subsequent processes.

Following the formation of the active regions 1502 an oxide layer (not shown) may be deposited over the exposed portions of the substrate 202, the active regions 1502, the distal ends 1202, the isolation fins 1002, the dummy gate stack 1301, and the spacers 1302. The oxide layer may be planarized using, for example, a CMP process that exposes the dummy gate stack 1301. The oxide layer is not shown in the figures for clarity.

Figure 16:
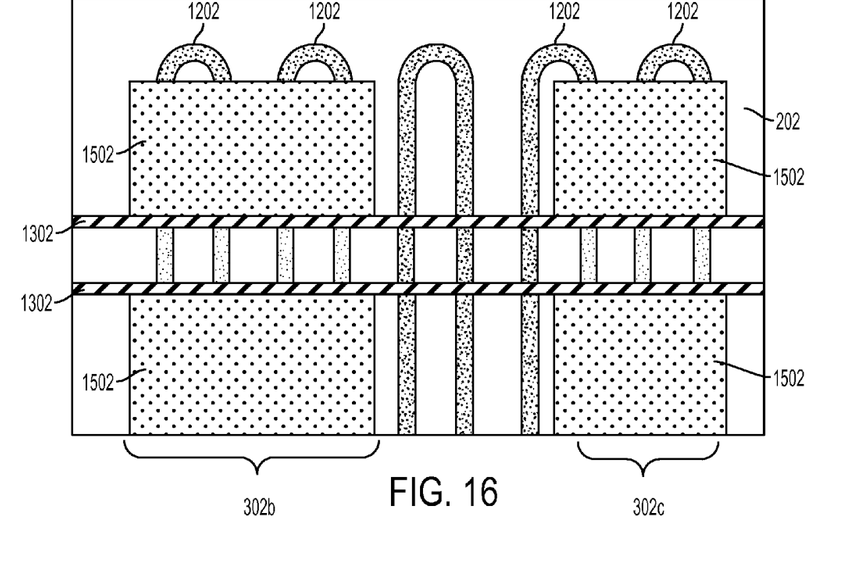
FIG. 16 illustrates a top view of the resultant structure following the removal of the dummy gate stack.

FIG. 16 illustrates a top view of the resultant structure following the removal of the dummy gate stack 1301 (of FIG. 15) using a suitable etching process that is selective to remove the capping layer 1304 and the polysilicon layer 1402. The removal of the dummy gate stack 1301 exposes the channel regions of the semiconductor fins 302b and 302c and portions of the substrate 202.

Figure 17:
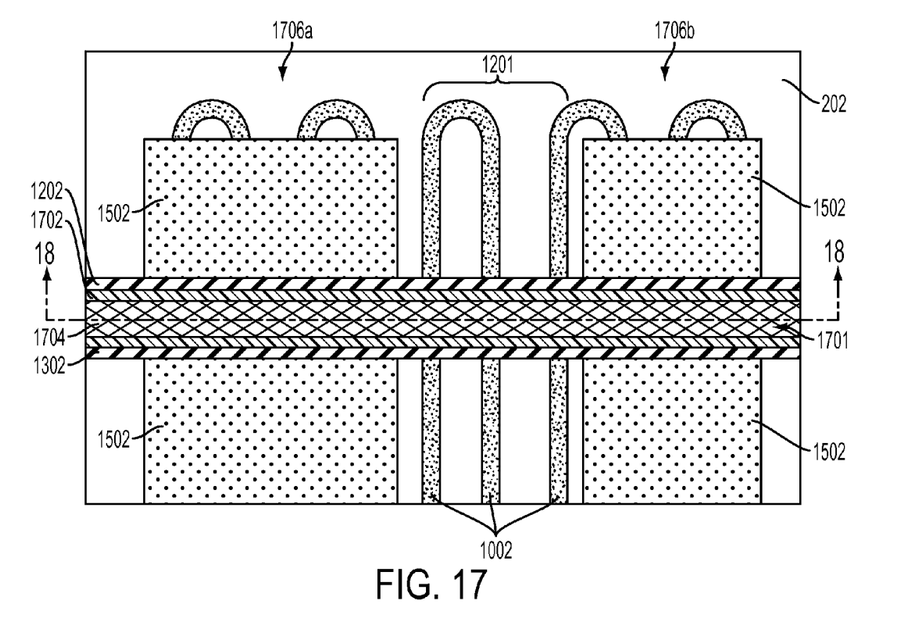
FIG. 17 illustrates the resultant structure following the formation of a gate stack.
Figure 18:
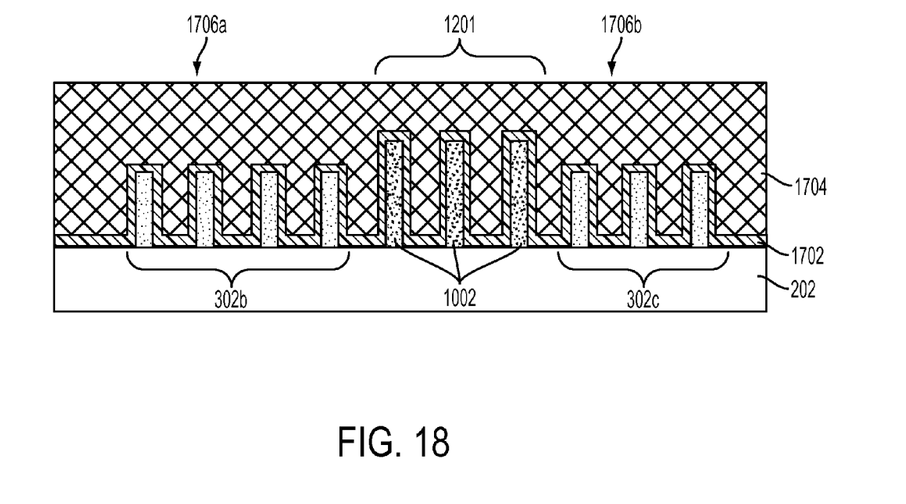
FIG. 18 illustrates a cut away view along the line 18 of FIG. 17.

FIG. 17 illustrates the resultant structure following the formation of a gate stack 1701. The gate stack 1701 is formed by, for example, depositing layers of gate stack material 1702 over exposed channel regions of the semiconductor fins 302b and 302c. The layers of gate stack material 1702 may include any number of layers of desired gate stack materials such as, for example, a high-K dielectric material layer and a gate metal layer. A gate conductor 1704 such as, for example, a conductive metallic material is formed over the layers of gate stack material 1702. FIG. 17 illustrates resultant multi-FET devices 1706a and 1706b that each include a plurality of multi-gate FETs (Fin-FETs) having merged active regions. The multi-FET devices 1706a and 1706b are isolated from each other by the isolation region 1201 that is partially defined by the isolation fins 1002. FIG. 18 illustrates a cut away view along the line 18 (of FIG. 17).

Figure 19:
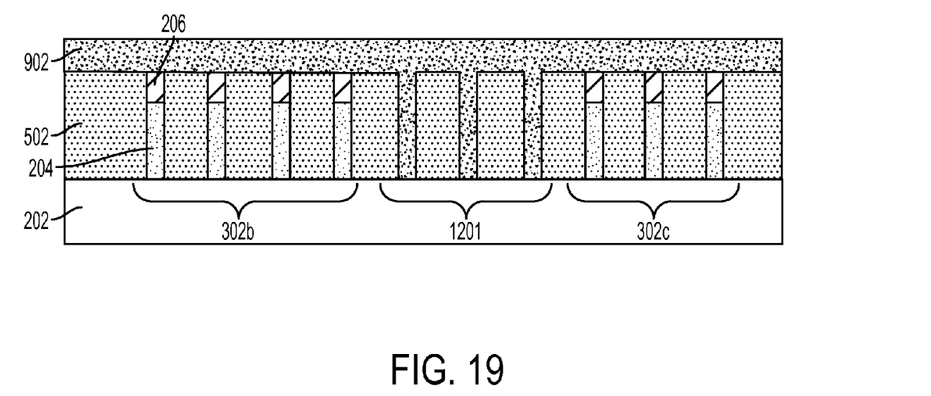
FIG. 19 illustrates an arrangement that is similar to the arrangement described in FIG. 9.
Figure 20:
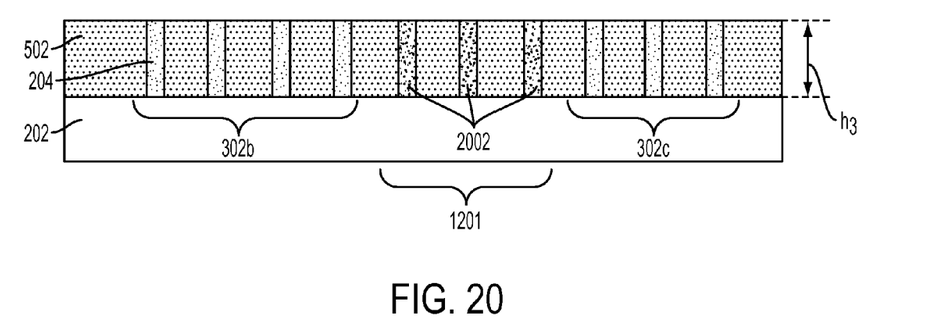
FIG. 20 illustrates the resultant structure following a planarization process.

FIGS. 19-21 illustrate an alternate exemplary method and embodiment for fabricating multi-FET devices. Referring to FIG. 19, FIG. 19 illustrates an arrangement that is similar to the arrangement described above in FIG. 9. Referring to FIG. 20, once the cavities 802 (of FIG. 8) have been filled with the dielectric material layer 902, portions of the dielectric material layer 902, portions of the sacrificial layer 502, and the hardmasks 206 are removed using a planarization process such as, for example, CMP that ceases removing material once the semiconductor fins 302b and 302c are exposed. The planarization process defines isolation fins 2002 that are substantially similar in height ($h_3$) as the semiconductor fins 302b and 302c.

Figure 21:
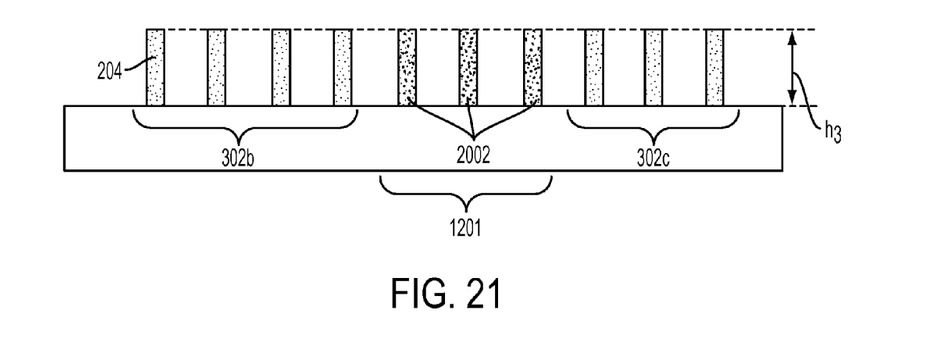
FIG. 21 illustrates the resultant structure following the removal of the sacrificial layer.

FIG. 21 illustrates the resultant structure following the removal of the sacrificial layer 502 in a similar manner as described above in FIGS. 11 and 12. The removal of the sacrificial layer 502 exposes portions of the substrate 202, the semiconductor fins 302b and 302c, and the isolation fins 2002. Once the sacrificial layer 502 has been removed, the similar processes as described above in FIGS. 13-18 may be performed to fabricate an arrangement of multi-FET devices that are isolated by an isolation region 1201 that includes the isolation fins 2002.

Figure 22:
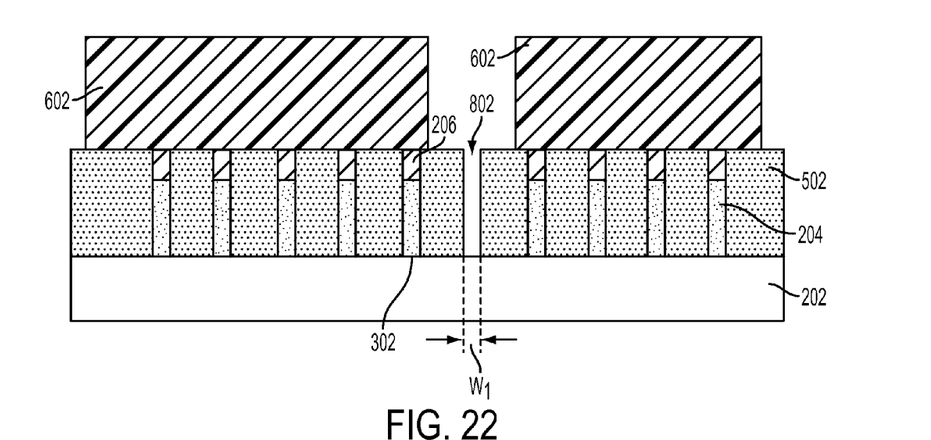
FIG. 22 illustrates an arrangement that is similar to the arrangement described in FIG. 5.
Figure 23:
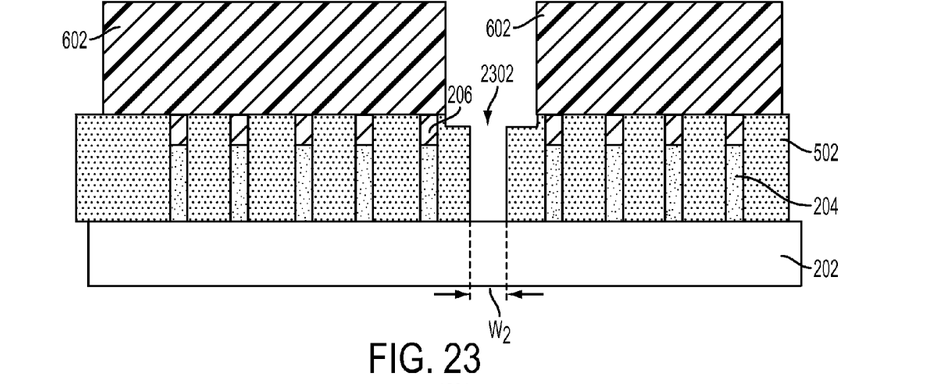
FIG. 23 illustrates cavities formed with an isotropic etching process.

FIGS. 22-24 illustrate another alternate exemplary method and embodiment for fabricating multi-FET devices. Referring to FIG. 22, FIG. 22 illustrates an arrangement that is similar to the arrangement described above in FIG. 5. Referring to FIG. 23, once the cavity(s) 802 having a width ($w_1$) has been formed by removing exposed hardmasks 206 and semiconductor fins 302, an isotropic etching process such as, for example, a wet etching process may be performed to remove exposed portions of the sacrificial layer 502 and increase the width of the cavity 802 resulting in a cavity 2302 having a width ($w_2$) that is greater than the width $w_1$.

Figure 24:
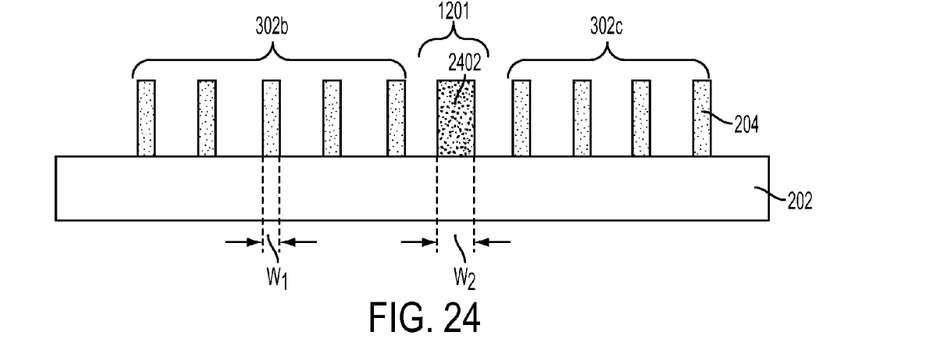
FIG. 24 illustrates the resultant structure following the removal of the sacrificial layer.

FIG. 24 illustrates the resultant structure following the removal of the resist 602, the deposition of a layer of dielectric material in a similar manner as described above in FIG. 9, the planarization of the resultant structure in a similar manner as described above in FIG. 20, and the removal of the sacrificial layer 502 (of FIG. 23) in a similar manner as described above in FIG. 21. The resultant structure includes an isolation fin 2402 having a width $w_2$ and semiconductor fins 302b and 302c having widths $w_1$. Once the sacrificial layer 502 has been removed, the similar processes as described above in FIGS. 13-18 may be performed to fabricate an arrangement of multi-FET devices that are isolated by an isolation region 1201 that includes the isolation fin(s) 2402.

Figure 25:
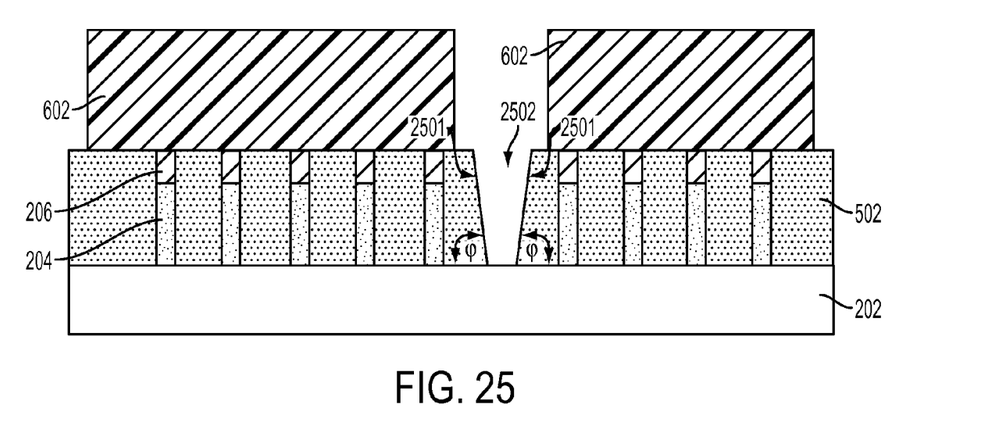
FIG. 25 illustrates a cavity having sloped sidewalls.
Figure 26:
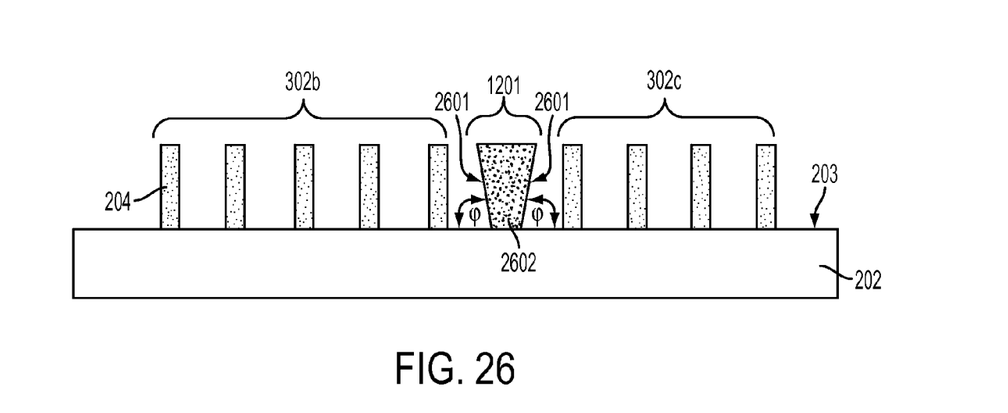
FIG. 26 illustrates the formation of an isolation fin having sloped sidewalls.

FIGS. 25-26 illustrate another alternate exemplary method and embodiment for fabricating multi-FET devices. Referring to FIG. 25, FIG. 25 illustrates an arrangement that is similar to the arrangement described above in FIG. 23, however the isotropic etching process results in a cavity 2502 having sloped sidewalls 2501 that are arranged at an oblique angle ($\phi$) relative to the planar surface 203 of the substrate 202.

FIG. 26 illustrates the resultant structure following the removal of the resist 602, the deposition of a layer of dielectric material in a similar manner as described above in FIG. 9, the planarization of the resultant structure in a similar manner as described above in FIG. 20, and the removal of the sacrificial layer 502 (of FIG. 25) in a similar manner as described above in FIG. 21. The resultant structure includes an isolation fin 2602 having sloped sidewalls 2601 that are arranged at an oblique angle ($\phi$) relative to the planar surface 203 of the substrate 202. Once the sacrificial layer 502 has been removed, the similar processes as described above in FIGS. 13-18 may be performed to fabricate an arrangement of multi-FET devices that are isolated by an isolation region 1201 that includes the isolation fin(s) 2602.

The methods and resultant structures described above provide an arrangement of multi-FET devices on a substrate that are isolated by isolation fins that define isolation regions on the substrate. The isolation fins provide a dummy gate stack with a more uniform height.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a field effect transistor (FET) device, the method comprising: forming a plurality of semiconductor fins on a substrate, wherein each semiconductor fin of the plurality of semiconductor fins includes a hardmask layer disposed thereon; depositing a sacrificial layer over exposed portions of the substrate and the hard mask layer; removing portions of the sacrificial layer to expose the hard mask layer; completely removing at least one semiconductor fin of the plurality of semiconductor fins from a portion of the substrate to form a cavity partially defined by the sacrificial layer; increasing a width of the cavity; filling the cavity with a dielectric material to form an isolation fin on the portion of the substrate such that a width of the isolation fin is greater than a width of at least one semiconductor fin of the plurality of semiconductor fins; and forming a gate stack over the plurality of semiconductor fins and the isolation fin.

2. The method of claim 1, wherein the hardmask layer includes a nitride material.

3. The method of claim 1, wherein the forming the isolation fin comprises depositing a layer of the dielectric material over the hardmask layer, the sacrificial layer, and in the cavity.

4. The method of claim 3, wherein the method further comprises removing portions of the layer of the dielectric material to expose the hardmask layer.

5. The method of claim 4, wherein the method further comprises removing the sacrificial layer.

6. The method of claim 4, wherein the method further comprises removing portions of the layer of the dielectric material and portions of the sacrificial layer to expose portions the plurality of semiconductor fins.

7. A method for fabricating a field effect transistor (FET) device, the method comprising:
patterning a first semiconductor fin, a second semiconductor fin, and a third semiconductor fin on a substrate, the second semiconductor fin arranged between the first semiconductor fin and the third semiconductor fin, the first semiconductor fin, the second semiconductor fin and the third semiconductor fin having a hardmask layer disposed thereon;

depositing a sacrificial layer over exposed portions of the substrate and the hardmask layer;

removing portions of the sacrificial layer to expose portions of the hardmask layer;

removing the hardmask layer disposed on the second semiconductor fin and completely removing the second semiconductor fin to form a cavity; increasing a width of the cavity followed by depositing a dielectric material in the cavity;

removing the sacrificial layer to define an isolation fin that includes the dielectric material in the cavity, and expose the first semiconductor fin and the third semiconductor fin; wherein a width of the isolation fin is larger than that of a width of the first and third semiconductor fins; and forming a gate stack over a portion of the first semiconductor fin, the isolation fin, and the third semiconductor fin.

8. The method of claim 7, wherein the hardmask layer includes a nitride material.

9. The method of claim 7, wherein the sacrificial layer includes an oxide material.

10. The method of claim 7, wherein the depositing the dielectric material in the cavity includes depositing a layer of the dielectric material over the hardmask layer, the sacrificial layer, and in the cavity.

11. The method of claim 10, wherein prior to removing the sacrificial layer to define the isolation fin, the method comprises removing portions of the layer of the dielectric material to expose the hardmask layer.

12. The method of claim 10, wherein prior to removing the sacrificial layer to define the isolation fin, the method comprises:

removing portions of the layer of the dielectric material to expose the hardmask layer; and removing portions of the sacrificial layer, the dielectric material, and the hardmask layer to expose a portion of the first semiconductor fin and a portion of the second semiconductor fin.

13. The method of claim 7, wherein the forming the gate stack comprises:

patterning a dummy gate stack over portions of the first semiconductor fin, the isolation fin, and the third semiconductor fin;

forming active regions over portions of the first semiconductor fin and the third semiconductor fin;

removing the dummy gate stack to expose channel regions of the first semiconductor fin and the third semiconductor fin; and forming the gate stack.

14. A method for fabricating a field effect transistor (FET) device, the method comprising:

forming a plurality of semiconductor fins on a substrate;

completely removing at least one semiconductor fin of the plurality of semiconductor fins from a portion of the substrate;

forming an isolation fin that includes a dielectric material on the portion of the substrate, the isolation fin having a trapezoidal shape with sloped sidewalls arranged at an oblique angle relative to a planar surface of the substrate; and forming a gate stack over the plurality of semiconductor fins and the isolation fin.

15. A method for fabricating a field effect transistor (FET) device, the method comprising:

forming a plurality of semiconductor fins on a substrate, wherein adjacent pairs of semiconductor fins are initially connected to one another by distal ends of semiconductor material;

completely removing at least one semiconductor fin of the plurality of semiconductor fins from a portion of the substrate, and removing the distal ends of semiconductor material so as to isolate the adjacent pairs of semiconductor fins from one another;

forming at least one isolation fin that includes a dielectric material on the portion of the substrate, wherein the dielectric material also replaces the distal ends of semiconductor material with distal ends of the dielectric material; and forming a gate stack over the plurality of semiconductor fins and the isolation fin.

* * * * *